United States Patent
Konstantinov

(10) Patent No.: US 9,425,262 B2
(45) Date of Patent: Aug. 23, 2016

(54) CONFIGURATION OF PORTIONS OF A POWER DEVICE WITHIN A SILICON CARBIDE CRYSTAL

(71) Applicant: FAIRCHILD SEMICONDUCTOR CORPORATION, San Jose, CA (US)

(72) Inventor: Andrei Konstantinov, Sollentuna (SE)

(73) Assignee: FAIRCHILD SEMICONDUCTOR CORPORATION, San Jose, CA (US)

(*) Notice: Subject to any disclaimer, the term of this patent is extended or adjusted under 35 U.S.C. 154(b) by 0 days.

(21) Appl. No.: 14/671,495

(22) Filed: Mar. 27, 2015

(65) Prior Publication Data

US 2015/0349062 A1    Dec. 3, 2015

Related U.S. Application Data

(60) Provisional application No. 62/004,513, filed on May 29, 2014.

(51) Int. Cl.

| H01L 27/01 | (2006.01) |
|---|---|
| H01L 27/12 | (2006.01) |
| H01L 31/0392 | (2006.01) |
| H01L 29/16 | (2006.01) |
| H01L 29/04 | (2006.01) |

(Continued)

(52) U.S. Cl.
CPC .......... H01L 29/1608 (2013.01); H01L 29/045 (2013.01); H01L 29/0619 (2013.01); H01L 29/872 (2013.01)

(58) Field of Classification Search
CPC .............. H01L 21/02529; H01L 21/0257; H01L 21/041; H01L 21/242; H01L 21/2022; H01L 21/762; H01L 27/0814; H01L 27/3248; H01L 27/1104; H01L 29/106; H01L 29/207; H01L 29/76; H01L 29/6603; H01L 29/435; H01L 29/1608; H01L 51/0508; H01L 51/5296
USPC .......... 257/49, 67, 69, 75, 77, 101, 104, 121, 257/213, 134, 233, 285, 288, 292, 396, 350, 257/352, 521, E21.041, E21.051, E21.053, 257/E21.055, E21.102, E21.115, E21.121, 257/E21.123, E21.182, E21.32, E21.344, 257/E21.352
See application file for complete search history.

(56) References Cited

U.S. PATENT DOCUMENTS

| 6,507,047 B2 | 1/2003 | Litwin |
| 6,853,006 B2 * | 2/2005 | Kataoka ................ H01L 29/045 257/77 |

(Continued)

OTHER PUBLICATIONS

Caldwell et al., "Recombination-Induced Stacking Fault Degradation of 4H—SiC merged-PiN-Schottky Diodes", Journal of Applied Physics, vol. 106, 044504, Aug. 21, 2009, 6 pages.

(Continued)

*Primary Examiner* — David Nhu
(74) *Attorney, Agent, or Firm* — Brake Hughes Bellermann LLP

(57) ABSTRACT

In one general aspect, an apparatus can include a silicon carbide (SiC) crystal having a top surface aligned along a plane and the SiC crystal having an off-orientation direction. The apparatus including a semiconductor device defined within the SiC crystal. The semiconductor device having an outer perimeter where the outer perimeter has a first side aligned along the off-orientation direction and a second side aligned along a direction non-parallel to the off-orientation direction. The first side of the outer perimeter of the semiconductor device having a length longer than the second side of the outer perimeter of the semiconductor device.

20 Claims, 11 Drawing Sheets

(51) Int. Cl.
*H01L 29/872* (2006.01)
*H01L 29/06* (2006.01)

(56) References Cited

U.S. PATENT DOCUMENTS

| | | |
|---|---|---|
| 7,785,706 B2 | 8/2010 | Schroeder et al. |
| 8,088,222 B2 | 1/2012 | Makarov et al. |
| RE43,840 E | 12/2012 | Kataoka et al. |
| 8,395,164 B2 | 3/2013 | Murphy et al. |
| 8,440,157 B2 | 5/2013 | Stoddard et al. |
| 8,470,091 B2 * | 6/2013 | Kitou ............ C30B 25/20 117/101 |
| 8,492,772 B2 | 7/2013 | Ellison et al. |
| 8,492,774 B2 | 7/2013 | Kusunoki et al. |
| 8,502,264 B2 | 8/2013 | Harle et al. |
| 8,536,582 B2 | 9/2013 | Zhang et al. |

OTHER PUBLICATIONS

Chung et al., "Direct Observation of Basal-Plane to Threading-Edge Dislocation Conversion in 4H—SiC Epitaxy", Journal of Applied Physics, vol. 109, 094906, May 12, 2011, 5 pages.

Heydemann et al., "Growth of 6H and 4H Silicon Carbide Single Crystals by the Modified Lely Process Utilizing a Dual-Seed Crystal Method", Appl. Phys. Lett., vol. 69, No. 24, pp. 3728-3730, Dec. 9, 1996.

Konishi et al., "Stacking Fault Expansion From Basal Plane Dislocations Converted Into Threading Edge Dislocations in 4H—SiC Epilayers Under High Current Stress", Journal of Applied Physics, vol. 114, 014504, Jul. 2, 2013, 5 pages.

* cited by examiner

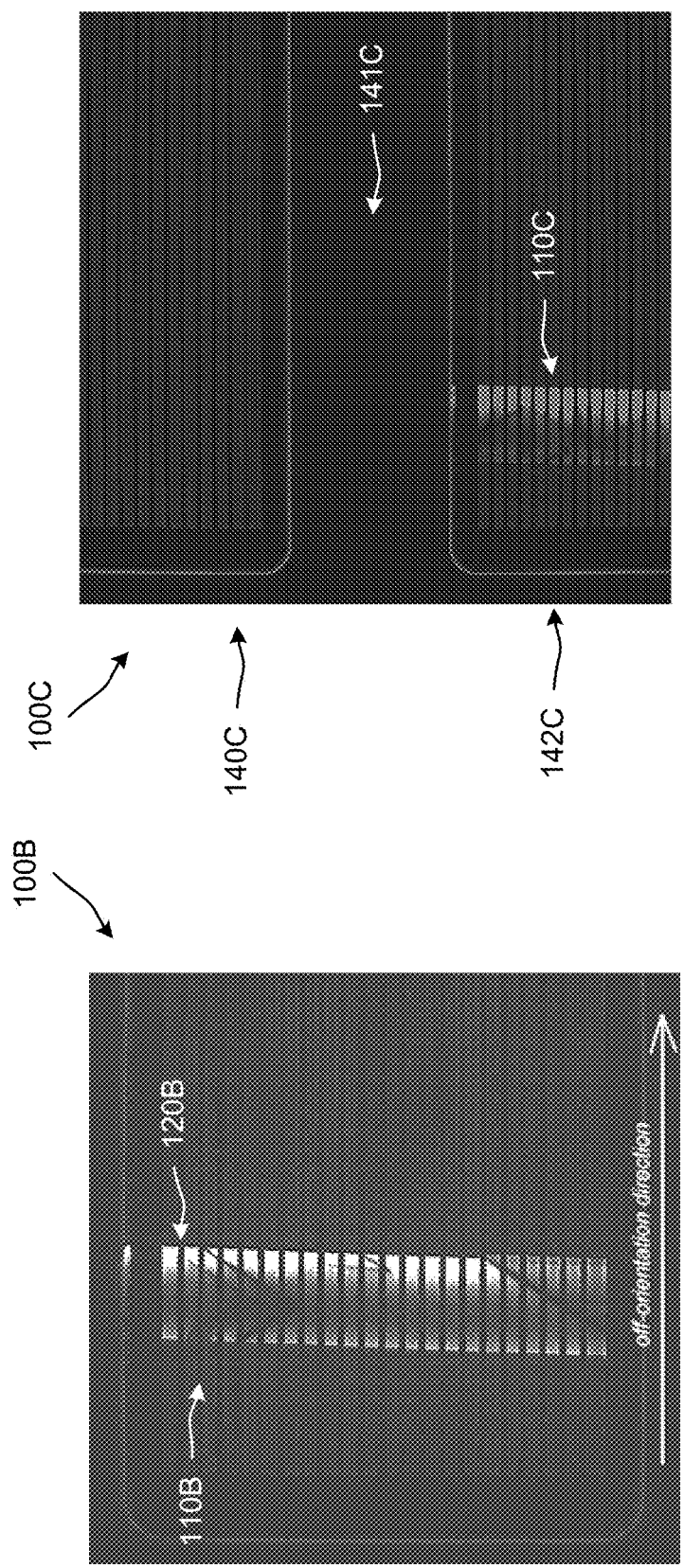

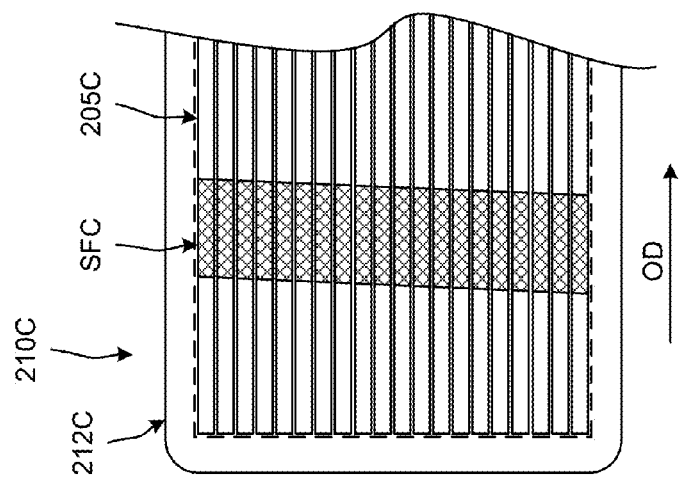
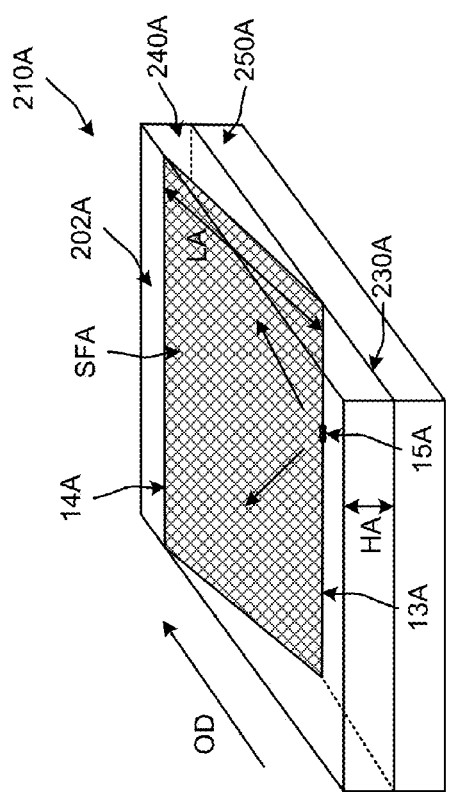
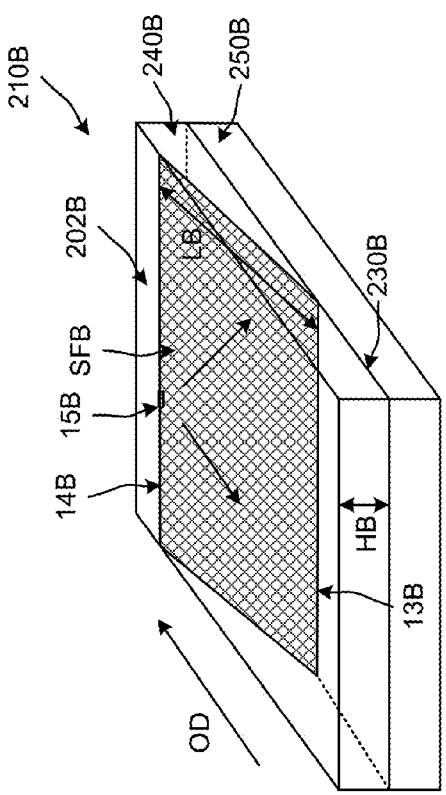
FIG. 2A
FIG. 2B
FIG. 2C

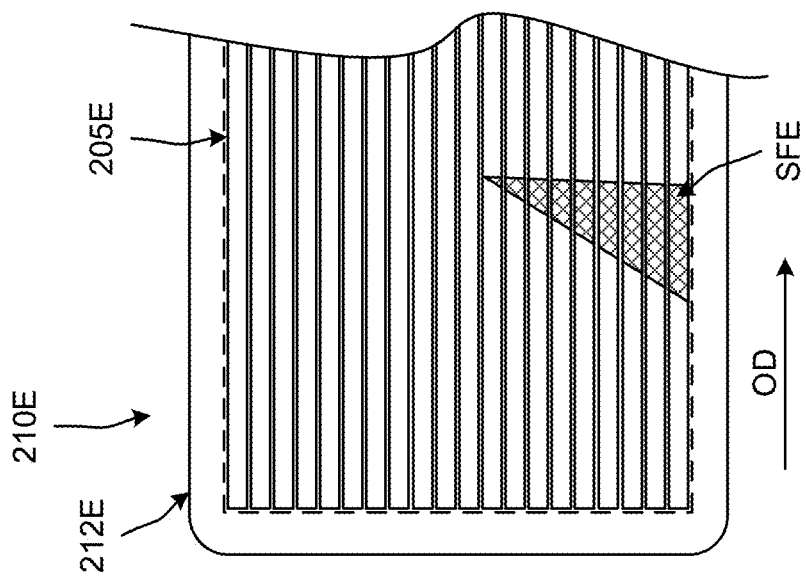
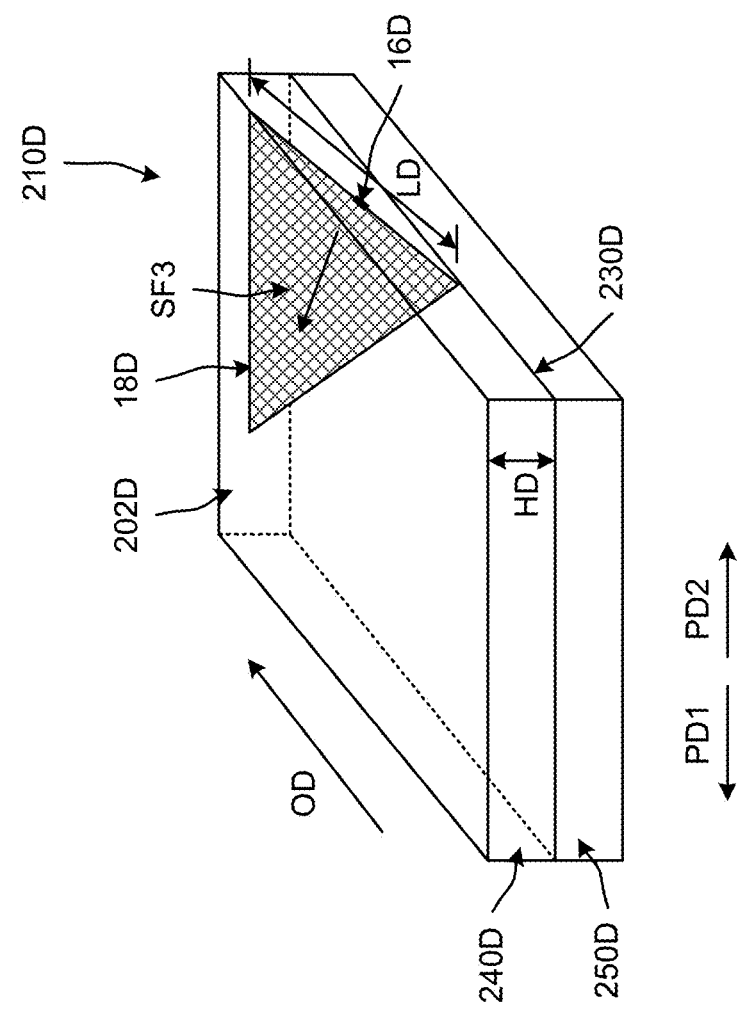

Time=TT1

Time=TT2

Time=TT3

CONFIGURATION OF PORTIONS OF A POWER DEVICE WITHIN A SILICON CARBIDE CRYSTAL

RELATED APPLICATION

This application is a Non-Provisional Patent Application claiming priority to and the benefit of Provisional Application Ser. No. 62/004,513, filed on May 29, 2014, and entitled, "Configuration of Portions of a Power Device Within a Silicon Carbide Crystal", which is incorporated herein by reference in its entirety.

TECHNICAL FIELD

This description relates to configurations of at least a portion of a power device within a silicon carbide crystal.

BACKGROUND

Silicon carbide (SiC) can be used to produce relatively high-performance power devices having low on-state, low switching losses, high-temperature operation and/or so forth due to high breakdown electric fields, high thermal conductivity and high saturated drift velocity of electrons in SiC. SiC is a wide bandgap semiconductor and may advantageously be used for manufacturing devices for high power, high temperature and high frequency applications. However, known semiconductor devices produced in SiC may not be robust against certain types of defects that can occur in SiC. Thus, a need exists for systems, methods, and apparatus to address the shortfalls of present technology and to provide other new and innovative features.

SUMMARY

In one general aspect, an apparatus can include a silicon carbide (SiC) crystal having a top surface aligned along a plane and the SiC crystal having an off-orientation direction. The apparatus including a semiconductor device having at least a portion defined within the SiC crystal. The semiconductor device having an outer perimeter where the outer perimeter has a first side aligned along the off-orientation direction and a second side aligned along a direction non-parallel to the off-orientation direction. The first side of the outer perimeter of the semiconductor device having a length longer than the second side of the outer perimeter of the semiconductor device.

The details of one or more implementations are set forth in the accompanying drawings and the description below. Other features will be apparent from the description and drawings, and from the claims.

BRIEF DESCRIPTION OF THE DRAWINGS

FIG. 1B and FIG. 1C are diagrams of emission images of stacking faults in SiC PN diodes.

FIGS. 2A through 2E illustrate various views of stacking faults of different types.

DETAILED DESCRIPTION

Figure 1A:
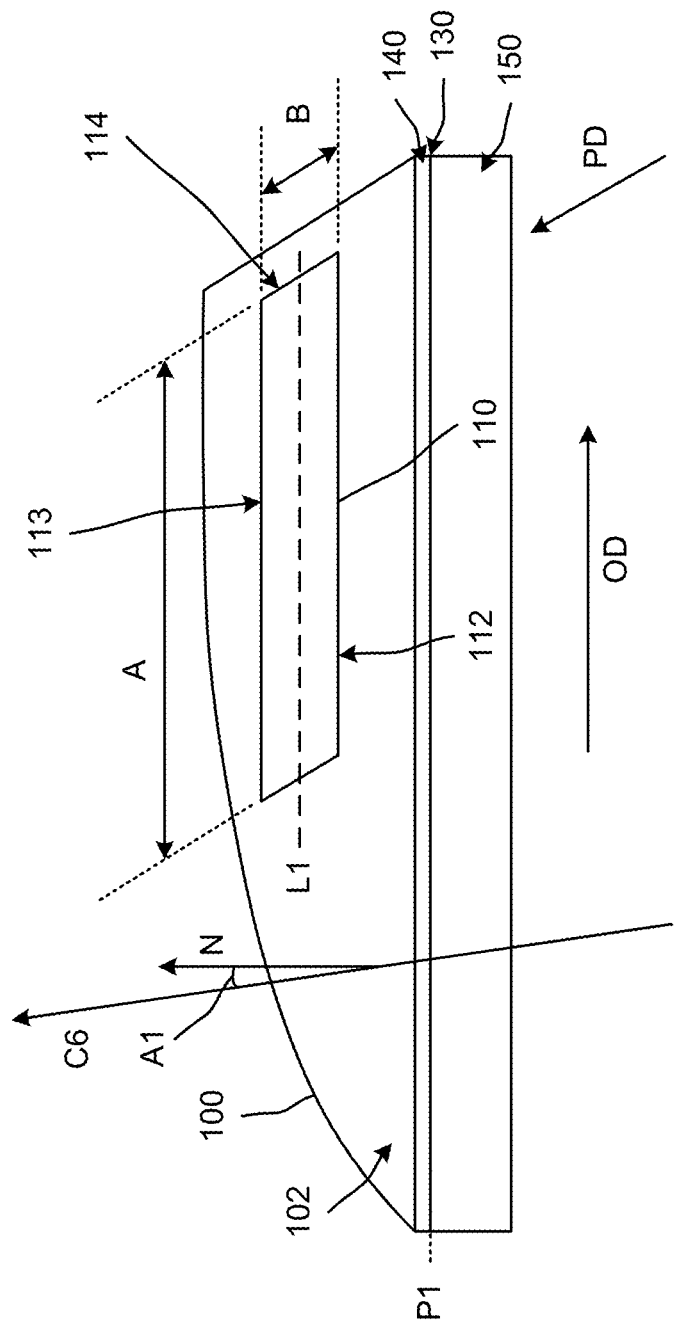
FIG. 1A is a diagram illustrating a silicon carbide (SiC) crystal and a semiconductor device.

FIG. 1 is a diagram illustrating a silicon carbide (SiC) crystal 100 (also can be referred to as a wafer or can be included in a wafer) and a semiconductor device 110. The semiconductor device 110 is formed in the SiC crystal 100, which includes or is included in an epitaxial layer 140 in this implementation. The semiconductor device 110 can be formed in a hexagonal SiC crystal 100, which can have a relatively small off-orientation from the basal (0001)Si or (000-1)C crystal plane. Such an off-orientation can provide a device-quality epitaxial layer of SiC on a hexagonal SiC substrate. The off-orientation angle can be between 1 and 8 degrees. In some implementations, the off-orientation angle can be between 4 and 8 degrees given SiC epitaxy technology. The off-orientation direction OD is generally defined as a projection of the inclined hexagonal axis onto the top crystal face. The semiconductor device 110 (and/or portions thereof) has a first side 113 aligned along (e.g., elongated along, substantially aligned along) an off-orientation direction OD. The semiconductor device 110 has at least a portion (e.g., doped regions, trenches, dielectrics, electrodes, etc.) that is formed within the epitaxial layer 140 (which can have a relatively low doping of, for example, around $10^{16}$ cm$^{-3}$ or lower) formed on a substrate 150 (which can be considered a portion (or a separate portion) of the SiC crystal 100). Both the epitaxial layer 140 and the substrate 150 can be, or can include, a SiC material. Accordingly, the epitaxial layer 140 and/or the substrate 150 can be referred to as a SiC material. Although not shown, various portions of the semiconductor device 110, such as metal layers, passivation layers, oxide layers, and/or so forth can be disposed above or on a surface of the SiC crystal (or wafer).

The first side 113 of the semiconductor device 110 has a dimension A that is longer than a dimension B of a second side 114 of the semiconductor device 110. Accordingly, the first side 113 can be referred to as a length side and the second side 114 can be referred to as a width side. The aspect ratio A:B of the semiconductor device 110 can be greater than 1 (e.g., 1.2:1, 3:2 (or 1.5:1), 2:1, 3:1), or substantially greater than 1.

The second side 114 is non-parallel to the first side 113 of the semiconductor device 110. In some implementations, the second side 114 is orthogonal to the first side 113. Accordingly, the semiconductor device 110 from a perspective of a plan view can have a rectangular shape or can have a non-rectangular shape (e.g., a parallelogram, a trapezoid).

As shown in FIG. 1, the perimeter 112 (also can be referred to as an outer perimeter) is defined within the SiC crystal 100. The perimeter 112 is defined at least in part by the first side 113 and the second side 114. In some implementations, the perimeter 112 is defined by an active region (or area). In some implementations, the perimeter 112 is defined by a termination region (or area) of the semiconductor device 110.

The semiconductor device 110 is oriented on the SiC crystal 100 such that the first side 113, which is longer than the second side 114, is aligned along the off-orientation direction OD. Accordingly, a longitudinal axis L1 of the semiconductor device 110 is aligned along the off-orientation direction OD. In this implementation, the longitudinal axis L1 is parallel to (or substantially parallel to) the off-orientation direction OD. The semiconductor device 110 has a surface area such that semiconductor device 110 is generally aligned along off-orientation direction OD. In other words, the aspect ratio of the semiconductor device 110 is defined such that an area (e.g., a surface area) of the semiconductor device 110, when viewed from above (e.g., when viewed in plan view), is generally aligned along off-orientation direction OD.

The semiconductor device 110 has at least a portion that is oriented within the SiC crystal 100 along (e.g., substantially along) the off-orientation direction OD to decrease (or minimize) an effect of defects (e.g., stacking faults) that can propagate within the semiconductor device 110 in a direction non-parallel to (e.g., orthogonal to) the off-orientation direction OD. For example, because certain types of defects (e.g., abundant defects) within the SiC crystal 100, such as stacking faults (SFs), can propagate along a direction PD non-parallel to the off-orientation direction OD. The effect of such stacking faults can be minimized by orienting the semiconductor device 110 along the off-orientation direction OD.

FIG. 1B is an image 100B that illustrates an emission image of a stacking fault 110B grown in, for example, a PN diode in 4H SiC as result of minority carrier injection due to electric current in the forward bias. In this implementation, a current of 4 A had been passed though this diode for approximately 10 minutes prior to imaging. The imaging was done under a forward current of around 2 A through a narrow bandpass filter with a peak transmission wavelength at 430 nm. The wavelength of around 430 nm corresponds to the peak wavelength of emission of so-called single-layer stacking faults, which grow in 4H SiC as result of minority carrier injection. The use of the narrow-band 430 nm filter therefore highlights configuration of the stacking fault 110B grown as a result of minority carrier injection, which process can be referred to as bipolar degradation in SiC. The image 100B shown in FIG. 1B was taken from the top surface, and certain portions of device emissions are masked with the top metal contact. The top contact was formed as a mesh structure so as to facilitate emission imaging from the top of the SiC crystal. The dark horizontal bars 120B on the image are results of masking the emission by the mesh contact. In this implementation, the period of contact mesh is 50 µm but can be different in other implementations. The total diode area, in this implementation, is approximately 4 mm². The direction of substrate off orientation is horizontal, as it is shown in the image 100B. It is seen from the image 100B that the stacking fault 110B propagates along approximately, the entire length of the device in the direction orthogonal to the off-orientation direction.

An observation is that the SF stripe 110B does not penetrate, in this implementation, an adjacent PN diode (not shown in FIG. 1B) on the SiC crystal provided the distance between adjacent PN diodes is substantially long (e.g., much greater than the diffusion length of minority carriers and/or the thickness of the low-doped drift region).

FIG. 1C illustrates an image 100C of the emission of two adjacent PN diodes on 4H crystal. The imaging conditions are the same (or approximately the same) as those for FIG. 1B, apart from a lower current density. PN diodes at the top and at the bottom had been simultaneously stressed flowing approximately 3 amps (A) forward current though for approximately 30 minutes. The stripe-shaped SF 110C has grown over entire width of the bottom PN diode 142C, however it did not penetrate the top PN diode 140C.

The image 100C shown in FIG. 1C can be qualitatively explained as follows. Injection-induced growth of stacking faults in hexagonal SiC can require a combination of a seed defect with injection of minority carriers. Both the top and bottom PN diodes 140C, 142C in FIG. 1C are under the conditions of the carrier injection that is sufficient for SF propagation. It is however only the bottom PN diode 142C that has the seed required for SF growth. The region 141C between the PN diodes 140C, 142C can be a void of minority carriers. This can explain why the SF growth terminates at the edge of the bottom PN diode 142C, and the top PN diode 140C is free from a stacking fault.

In some implementations, an elongated chip configuration as it is shown in FIG. 1 can have a disadvantage in high-power device applications, because such a layout of device chip implicates a lower percentage of useful device area as compared to a quadratic or to a near-quadratic layout. A certain portion of the chip area can be inevitably consumed by high voltage termination at the device periphery as well as by the dicing lanes. The percentage of lost useful area can be progressively increased with increasing deviation of the aspect ratio A:B. However, the device elongated along the off-orientation direction will have the advantage of improved stability if the bipolar degradation occurs in the course of operation.

Orienting the semiconductor device 110 along the off-orientation direction OD can be advantageous over, for example, material improvement through optimized SiC substrates, epitaxial growth parameters and though using improved buffer/layer structures. This technique of orientation can be also combined with material improvement so as to decrease the probability for generation of stripe stacking faults as those shown in, for example, FIGS. 1B and 1C. In some implementations, the semiconductor device 110 can be aligned a few degrees to a 10-20 degrees from the off orientation direction OD. In some implementations, an off-orientation of up to around 30 degrees may not substantially increase, for example, a length of a SF stripe.

Because the first side 113 is aligned along the off-orientation direction OD, a defect such as a stacking fault, when propagating along (or longitudinally aligned along) the propagation direction PD and along a width of the semiconductor device 110, may have a minimal (or reduced) effect on the semiconductor device 110. In other words, the defect can have a relative small effect on the semiconductor device 110 with a propagation along the length of the semiconductor device 110 when the semiconductor device 110 is longitudinally oriented along (e.g., elongated along) the propagation direction PD. Because the semiconductor device 110 can include many cells (e.g., device cells, metal-oxide-semiconductor field effect transistor (MOSFET) (e.g., vertical MOSFET) device cells, bipolar junction transistor (BJT) device cells), a number of the device cells effected by a defect can be reduced (e.g., minimized) with the semiconductor device 110 being longitudinally aligned along the off-orientation direction and non-parallel to (e.g., orthogonal to) the propagation direction PD. As mentioned above, various portions of the semiconductor device 110, such as metal layers, passivation layers, oxide layers, and/or so forth can be disposed above or on a surface of the SiC crystal (or wafer).

In some implementations, orienting the semiconductor device 110 along the off-orientation direction OD can be advantageous for devices utilizing no injection for carrier transport under standard operation conditions, such as Schottky-barrier diodes (SBDs), metal-oxide semiconductor field-effect transistors (MOSFETs) and junction field-effect transistors (JFETs). As an example, SBDs in SiC can include certain PN-diode portions so as to pass surge forward current without excessive forward voltage drop. It is possible that minority carrier injection occurs in an event of surge current, which may result in growth of a stacking fault, i.e. in bipolar degradation. Minority carrier injection may also occur in a MOSFET or JFET in the event of opening the body diode.

In many the embodiments described herein, the epitaxial layer 140 and/or the substrate 150 may be, or may include, hexagonal SiC of the 4H polytype modification of SiC. The stacking fault can originate (e.g., originate at a dislocation) along an interface 130 between the epitaxial layer 140 and the substrate 150 and/or along a top surface of the epitaxial layer 140. The stacking fault can propagate along (e.g., generally along) the direction PD. The stacking fault can also propagate along a basal plane (not shown) from a dislocation (also can be referred to as a basal plane dislocation (BPD)) at the interface 130 to a top surface 102 of the SiC crystal 100. The basal plane can be a (0001) crystal plane, which can be at an angle (not shown) between 2 to 8 degrees from a plane P1 along which the interface 130 is aligned. This angle can correspond with angle A1 (which can be referred to as an off-orientation angle) between a C6 axis and a normal N to the interface 130. In some implementations, an off-orientation angle can be advantageous for obtaining epitaxial layers of sufficiently high quality on SiC. The semiconductor device 110 (e.g., a SiC power device) can utilize off-oriented SiC materials (including the substrate 150 and/or the epitaxial layer 140 (and/or additional epitaxial layers)), because off-orientation can result in relatively high-quality epitaxial growth of the epitaxial layer 140 that can be used to form the semiconductor device 110. Formation (e.g., growth) of a SiC epitaxial layer that is free (e.g., substantially free) from foreign polytype inclusions or dislocations on on-axis SiC crystals can be relatively difficult. In some implementations, a SiC crystal can include as many as 1000 BPDs/cm$^2$.

Minority carrier injection (e.g., minority carrier injection during operation of the semiconductor device 110) into the epitaxial layer 140 (and/or other active layers) and/or into the substrate 130 can result in growth of the stacking faults (which is described in more detail below). Such stacking faults can cause additional resistance for vertical majority carrier flow and/or traps for minority carriers (e.g., a quantum well) in the semiconductor device 110. The extent of a decrease in conductance (e.g., vertical conductance) of a majority carrier device, such as semiconductor device 110, can increase with increase of the portion of the semiconductor device 110 that is blocked for vertical current flow by a stacking fault. Thus, the orientation (or layout) of the semiconductor device 110 within the SiC crystal 100 with respect to the off-orientation direction OD can reduce, or minimize, the adverse effects of the stacking fault.

In some implementations, a basal plane dislocation seeding a stacking fault (e.g., a stacking fault stripe) may be formed as result of dislocation transformations during epitaxial growth of the epitaxial layer 140. A portion of basal plane dislocation may be formed by transformation of, for example, a threading dislocation (TD). The treading dislocation can be aligned a direction normal to (e.g., substantially normal to) the interface 130 or plane P1. Transformations of threading dislocations to basal plane dislocations and back can occur in formation (e.g., growth) of SiC material. In some implementations, the mechanisms can include interactions with one or more growth steps and/or with one or more screw dislocations.

As mentioned above, degradation (e.g., bipolar degradation) in a SiC material can result from the growth of stacking faults that are induced by minority carrier injection in the semiconductor device 110. The stacking faults can either exist in as-grown material or originate from dislocations (e.g., BPDs), as a result of the dislocations splitting into, for example, Shockley partials. In the case of a dislocation splitting, one of the partials can remain bound to the location of the dislocation whereas the other partial may travel tens or even hundreds of microns in the semiconductor device 110 as long as minority carriers are provided to the leading edge of the partial. The glide of a partial dislocation can occur in general within the basal (0001) crystal plane (e.g., it can form at a certain angle with the substrate surface that is equal to the substrate off-orientation angle). The (0001) plane portion between the two partials can then represent a stacking fault. With an off-orientation of 2 to 8 degrees, even a single stacking fault can have substantially large dimensions.

The stacking faults may form resistive barriers for current flow in the semiconductor device 110 and/or can define channels for relatively fast minority carrier recombination. The formation of stacking faults can suppress transport (e.g., vertical transport) of minority carriers in the semiconductor device 110 and/or can increase the on-state forward voltage drop of the semiconductor device 110. In particular, the formation of stacking faults can increase the on-state resistance, decrease current gain, and/or so forth of the semiconductor device 110.

For example, a relatively high-power SiC semiconductor device (e.g., greater than 400 V device) may be driven into bipolar operation mode even if the devices are predominantly designed for majority carrier operation. As a specific example, a SiC MOSFET and/or JFET device may utilize a body diode for reverse conduction. A SiC Schottky rectifier can provide a parallel PN diode (or a PN diode array) so as to avoid device burnout under surge current conditions. Even if a circuit is not configured to utilize the body diode of the SiC MOSFET and/of JFET device, such a body diode might open under the surge current conditions. It may be desirable to minimize bipolar degradation of the SiC material even for majority-carrier devices.

Due to the crystal symmetry of SiC material the stacking faults have certain configurations, which can be aligned to crystal axes of the SiC material. In, for example, stressed PN diodes in SiC material at least two defect types can exist—stacking fault triangels and stacking fault stripes.

In some implementations, because the aspect ratio of the semiconductor device 110 is elongated (when viewed from a top view on the surface of the SiC crystal 100), the semiconductor device 110 can have thermal advantages or efficiencies. For example, the semiconductor device 110 can be configured to dissipate heat laterally in a direction along the width 114 (e.g., in a direction away from a longitudinal axis or orthogonal to the length 113 of the semiconductor device 110).

In the implementations described herein, the semiconductor device 110 can be vertical silicon carbide high voltage power device. Vertical can indicate predominantly a vertical direction as a current transport, as compared with a predominantly lateral direction for current transport in a metal-semiconductor field-effect transistor (MESFET) or in a laterally diffused MOSFET (LDMOS). In some implementations, a high-voltage vertical device can include a high voltage termination around periphery of the device so as to prevent early breakdown at the edge of the device. Multiple types of high voltage termination can include, for example, a junction termination extension (JTE), floating guard rings (FGRs), combinations of both above, as well as other types of high voltage termination.

In the implementations described herein, the semiconductor device 110 can be silicon carbide high voltage high power device. Such a high-power device can require a large device area, which implies a high probability for incorporation of a seed defect, which may act as a seed for stacking fault growth under the conditions of minority carrier injection. Power devices having a relatively low power rating and a small area have much lower probability for bipolar degradation. In the implementations described herein, the lower boundary for a minimum rated voltage and a minimum rated current of the semiconductor device 110 (as a high-power device) can be approximately 400 Volt and 4 Amperes, respectively. This current rating will correspond to a minimum physical device area of at least approximately 1 mm$^2$, because a power density of above approximately 400-600 W/cm$^2$ may be not appropriate in a large-area device from the viewpoint of thermal management.

An example junction termination is seen in the emission imaged in FIG. 1B and in FIG. 1C. The imaged devices include an ion-implanted JTE around the device periphery. The emission due to residual ion damage in the JTE region is visible around the device periphery in, for example, FIG. 1C. The inner part of the JTE, i.e. the part adjacent to the PN diode anode can contribute to light emission because of high resistance of ion-implanted JTE. In some implementations, rounded anode edges can be another feature of device termination because a sharp edge can be potential source of electric field crowding and of early avalanche breakdown as a result of crowding. The width of the high voltage termination region in SiC high voltage devices can be between a few tens and a few hundred microns, depending on the design and on the rated voltage.

Various views of stacking faults of different types are illustrated in FIGS. 2A through 2E. The stacking faults are included in semiconductor devices 210A through 210E. The semiconductor devices 210A through 210E are oriented longitudinally along the off-orientation direction OD and non-parallel to (e.g., substantially non-parallel to) propagation directions of stacking faults. The regions (or areas) within the semiconductor devices 210A through 210E covered by the stacking faults can be referred to as stacking fault regions or areas.

As mentioned above, the stacking faults can be formed from a dislocation that can function as a seed and can be formed during operation of a semiconductor device in the presence of minority carriers. The stacking faults may not be formed in regions, or may terminate at regions, where minority carriers are not present or excluded. The stacking fault can be, for example, single-layer stacking faults included in, for example, a 4H SiC crystal. In some implementations, the stacking faults propagate only within regions that are doped and/or where minority carriers may be present during operation. In some implementations, the doped region can correspond with an active region. The stacking faults do not propagate outside of a region that is free of (e.g., substantially free of) minority carriers.

FIG. 2A is a diagram that illustrates a stacking fault stripe SFA included in an epitaxial layer 240A on a substrate 250A of a SiC crystal. The stacking fault stripe SFA propagates from a dislocation 15A at an interface 230A between the epitaxial layer 240A and the substrate 250A (i.e., epi-to-substrate dislocation) and a top surface 202A of the epitaxial layer 240A. A bottom boundary 13A of the stacking fault stripe SFA is formed along the interface 230A along direction PD1 and/or direction PD2. The stacking fault stripe SFA is also formed up to (along a basal plane) a top boundary 14 along the top surface 202A of the epitaxial layer 240A. In some implementations, the stacking fault strip SFA can be formed via propagation along the arrows from the dislocation 15A. In some implementations, a stacking fault stripe can also develop from an interfacial (e.g., horizontal) dislocation at the interface border of, for example, an n0 region and a p+ region.

As shown in FIG. 2B, in situations where a dislocation 15B is at, for example, a top surface of the epitaxial layer 240B, a stacking fault stripe SFB can be formed via propagation from the dislocation 15B along the arrows shown in FIG. 2B. The stacking fault stripe SFB is formed from a top boundary 14B along a top surface 202B of the epitaxial layer 240B to a bottom boundary 13B.

FIG. 2C is a diagram that illustrates an example of a top view (e.g., plan view) of a stacking fault stripe SFC (represented with hashed areas) within a doped region 205C (represented by a dashed line) of a semiconductor device 210C. The stacking fault stripe SFC propagates only within the active region 205C that is doped and where minority carriers may be present during operation. In some implementations, minority carriers can be present in the semiconductor device 210C up to a perimeter 212C (also can be referred to as an outer perimeter) such that the stacking fault stripe SFC can propagate to the perimeter 212C. The perimeter 212C can correspond with, or can be associated with, for example, a termination region. An image of emissions from the stacking fault stripe SFC can be captured using, for example, a CCD camera with a filter (e.g., at 430 nm).

FIG. 2D is a diagram that illustrates a stacking fault triangle SFD included in an epitaxial layer 240D on a substrate 250D of a SiC crystal. The stacking fault stripe SFD propagates from a dislocation 16D parallel to (or substantially parallel to) the off-orientation direction OD). The stacking fault triangle SFD can be formed via propagation along the arrow. The stacking fault triangle SFD is formed along direction PD1 and/or direction PD2. The stacking fault triangle SFD is also formed up to (along a basal plane) a top boundary 18D along the top surface 202D of the epitaxial layer 240D. In some implementations, the stacking fault triangle SFD can form, for example, a 60-degree right-angle triangle (where the right angle is along the top boundary 18D).

FIG. 2E is a diagram that illustrates an example of a top view (e.g., plan view) of a stacking fault triangle SFE (represented with hashed regions) within a doped region 205E (represented by a dashed line) of a semiconductor device 210E. In some implementations, minority carriers can be present in the semiconductor device 210E up to a perimeter 212E such that the stacking fault triangle SFE can propagate to the perimeter 212E. The perimeter 212E can correspond with, or can be associated with, for example, a termination region. An image of emissions from the stacking fault triangle SFE can be captured using, for example, a CCD camera with a filter (e.g., at 430 nm).

FIGS. 2A through 2E illustrate configuration of stacking faults due to bipolar degradation in a SiC material (e.g., SiC crystal). Defect lengths LA, LB, and LD along the off-orientation direction OD are defined by the thicknesses HA, HB, and HD of the epitaxial layer 240A, 240B, and 240C, shown in FIGS. 2A, 2B, and 2C, respectively. The defect lengths LA, LB, and LD can be represented by the following formula: $L = H/\tan(ALPHA)$, where ALPHA is the off-orientation angle, H represents thickness, and L represents defect length. In some implementations, stacking faults can be clustered (e.g., consist of more than one stacking fault). Clustering of stacking faults, however, may not significantly increase the defect length L (e.g., defect length LA, LB, and/or LD).

Figure 3A:
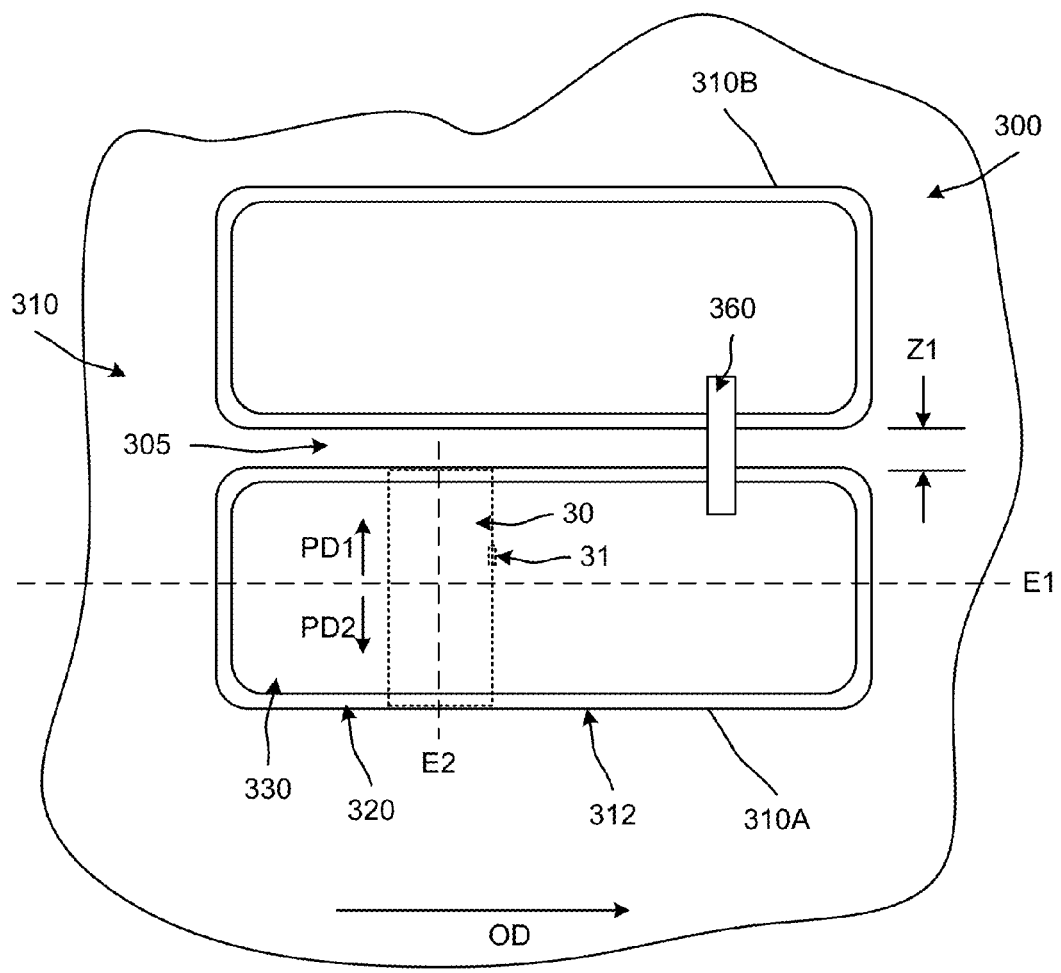
FIG. 3A is a diagram that illustrates portions that operate as a semiconductor device within a SiC crystal.

FIG. 3A is a diagram that illustrates two portions 310A and 310B (which can be referred to a pair of portions) that collectively operate as a single semiconductor device 310 within a SiC crystal 300. The portion 310A and the portion 310B are electrically coupled by interconnect 360 (e.g., a metal interconnect, a polysilicon interconnect, a bonding wire, a ribbon). In some implementations, the portion 310A and the portion 310B can be electrically coupled by more than a single interconnect (e.g., multiple interconnect). In some implementations, the interconnect 360 can be insulated by a dielectric (not shown). The interconnect 360 can be referred to as an interconnect portion or as an interconnect conductor.

As shown in FIG. 3A, a stacking fault area 30, which propagates from a dislocation 31, is disposed within a portion 310A of the semiconductor device 310. The semiconductor device 310 has a termination region 320 and an active region 330. The termination region 320 can be an ion-implanted JTE or an array of FGR or any other planar-type termination. The portion 310A of the semiconductor device 310 includes a perimeter 312.

As shown in FIG. 3A, the two portions 310A and 310B are longitudinally aligned along the off-orientation direction OD. Specifically, portion 310A is aligned along longitudinal axis E1 such that the stacking fault area 30 is aligned along longitudinal axis E2. Accordingly, an aspect ratio (e.g., length:width) of the portion 310A is non-parallel to an aspect ratio (e.g., length:width) of the stacking fault area 30. The stacking fault are 30 is longitudinally aligned along an axis non-parallel to (or orthogonal) to that of the portion 310A. The aspect ratio of each of the individual portions 310A and 310B is different than the aspect ratio (or alignment) of the semiconductor device 310 (including both portions 310A and 310B).

Although not shown in FIG. 3A, in some implementations, individual portions can each have a width (or length) that is orthogonal to (or near orthogonal to or non-parallel to) a width (or length) of a semiconductor device including the individual portions. In such instances, the semiconductor device can have a width (or length) that is parallel to (or aligned along) a width (or length) of a stacking fault. In other words, the semiconductor device and stacking fault can each have a longitudinal alignment that is the same, but orthogonal to the longitudinal alignment of the individual portions included in the semiconductor device.

In the case of a triangular stacking fault, the portion can be aligned with respect to the off-orientation direction OD so that the boundary of the triangular stacking fault (e.g., a top boundary (e.g., the top boundary 18D in FIG. 2D)) can be longitudinally aligned along an axis non-parallel to (or orthogonal to) an axis of a portion of a semiconductor device (e.g., portion 310A of the semiconductor device 310) along which the portion of the semiconductor device is aligned.

As shown in FIG. 3A, the portion 310A and the portion 310B are separated by a stacking fault separation region 305 having a dimension Z1 (also can be referred to as a spacing, width, or as a stacking fault separation volume or area). The stacking fault separation region 305 is devoid (e.g., substantially devoid of) minority carriers such that the stacking fault area 30 does not propagate into the portion 310B of the semiconductor device 310. The portion 310A and the portion 310B are separated so that the stacking fault area 30 does not propagate across the entirety of the semiconductor device 310 (or into another or adjacent portion). The stacking fault stripe 30 may not propagate from portion 310A to portion 310B (which is adjacent to portion 310A (without another intervening portion) or is the next nearest portion to portion 310A) even if portion 310B is stressed at a relatively high forward current density. Thus, the stacking fault stripe 30 can be restricted using geometrical constraints. The stacking fault stripe 30 propagates across the entirety of (or substantially the entirety of) the portion 310A (e.g., the active region 330 of portion 310A), however, in some implementations, the stacking fault stripe 30 propagates across only a portion (e.g., a portion of a width) of the portion 310A.

The stacking fault separation region 305 is disposed outside of the active region 330 of the portion 310A and/or the portion 310B. The stacking fault separation region 305 is disposed between the termination region 320 of the portion 310A and the termination region (not labeled) of the portion 310B. The dimension Z1 (or width) of the stacking fault separation region 305 is aligned orthogonal to (e.g., substantially orthogonal to) the lengths of the portions 310A, 310B and/or is aligned orthogonal to (e.g., substantially orthogonal to) the off-orientation direction OD.

Figure 5:
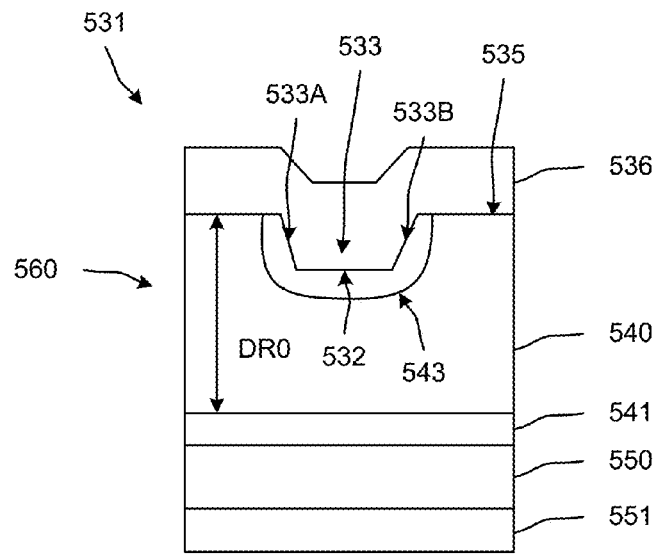
FIGS. 5 and 6 illustrate a SiC junction-blocked Schottky-barrier rectifier (JBS).
Figure 6:
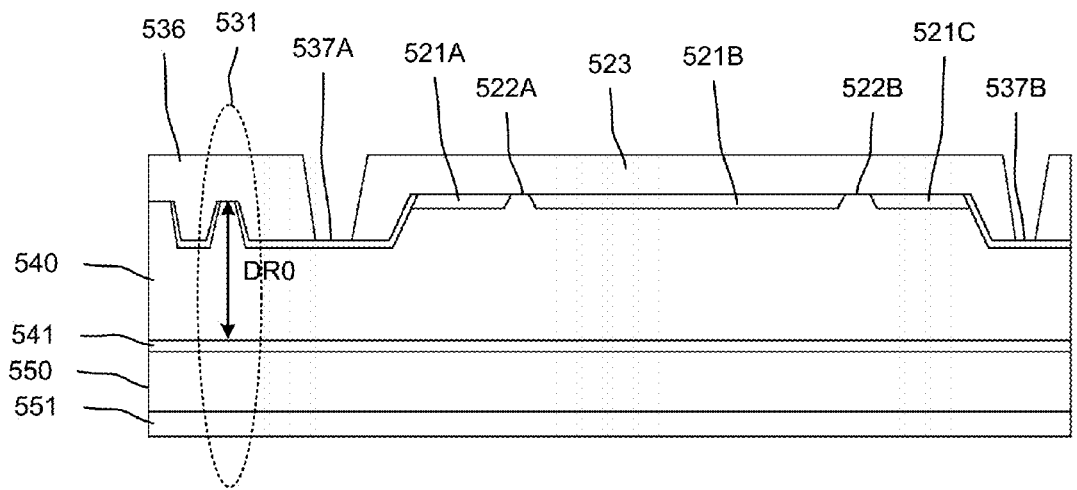

In some implementations, the dimension Z1 between the portion 310A and the portion 310B can be greater than (e.g., at least 2 times) or equal to a thickness (e.g., thickness HA in FIG. 2A, thickness HB in FIG. 2B, thickness of 140 in FIG. 1) of one or more epitaxial layers (not shown). In some implementations, the one or more epitaxial layers can be relatively low-doped layers associated with, for example, a drift region of the semiconductor device 310. In some implementations, the dimension Z1 (or width) can be greater than (e.g., at least 2 times greater than) or equal to a size (e.g., a depth, length, or thickness) of a drift region of the semiconductor device 310 (or a portion thereof). An example of a drift region having a depth DR0 is shown in FIGS. 5 and 6. The portions 310A, 310B have a rectangular shape, but in some implementations, one or more of the portions 310A, 310B can have a non-rectangular shape (e.g., a parallelogram, a trapezoid, a triangle).

Figure 3B:
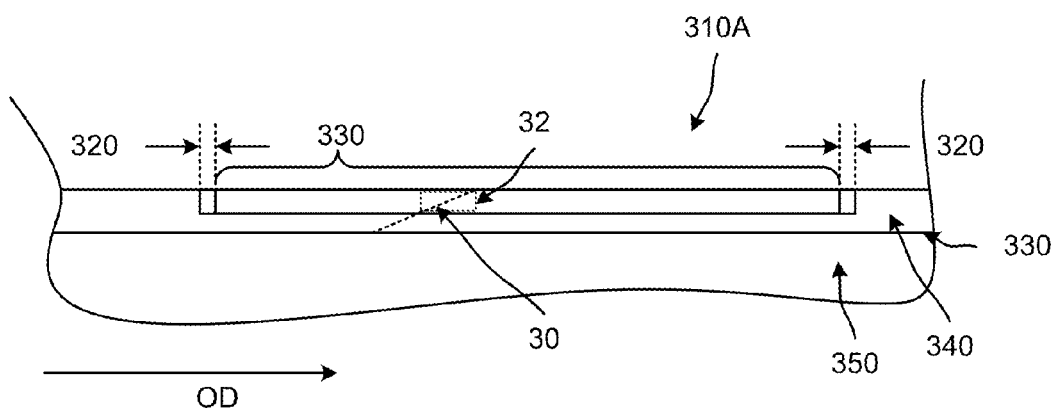
FIG. 3B is a side view of the portion of the semiconductor device shown in FIG. 3A.

FIG. 3B is a side view of the portion 310A of the semiconductor device 310. The portion 310A of the semiconductor device 310 can include doped regions (e.g., source regions, body regions, drift regions, etc.), trenches, dielectrics, and/or so forth that are formed within an epitaxial layer 340. Other portions of the semiconductor device 310 above a top surface of the epitaxial layer 340, such as metal layers, runners, dielectric layers, polysilicon layers, and/or so forth are not shown. The stacking fault area 30 extends within the epitaxial layer 340 (which can be included in the SiC crystal 300) from an interface 330 between the epitaxial layer 340 and a substrate 350 (which can also be considered a portion (or a separate portion) of the SiC crystal 300). The angle of the stacking fault 30 (which can be substantially aligned along a basal plane) from the interface 330 is not drawn to scale in FIG. 3B and can be between, for example, 2 to 8 degrees. A C6 axis (not shown in FIG. 3B) can be normal to the stacking fault 30.

As shown in FIG. 3B, the portion 310A has an active region 330 disposed within the termination region 320 and includes several active device cells (e.g., vertical MOSFET device cells, BJT device cells). A portion 32 of the device cells in the active region 330 are adversely affected by the stacking fault 30 because the stacking fault 30 intersects the portion 32 of the device cells. Device cells that are not intersected by the stacking fault 30 are not adversely affected by the stacking fault 30. If the portion 310A were not aligned along the off-orientation direction OD, a number of device cells adversely affected by the stacking fault 30 would be much larger.

In some implementations, a quantity of a decrease in on-state conductance (represented by K) of the semiconductor device 110 can be calculated based on a fraction of defect area: $K=S_{SF}/S$, where S is the total area of the semiconductor device 310 (or portion thereof) and $S_{SF}$ is the area of the stacking fault(s). For a single-stripe stacking fault the on-state conductance K can be calculated by $K=L/A$ where L is defect length and A is the device length along the off-orientation direction.

In some implementations, the portion 310A and the portion 310A can have different surface areas or outer profiles (when viewed in plan view). For example, portion 310A can have a different aspect ratio than portion 310B. In some implementations, portion 310A can have a different length and/or width than portion 310B.

Figure 4:
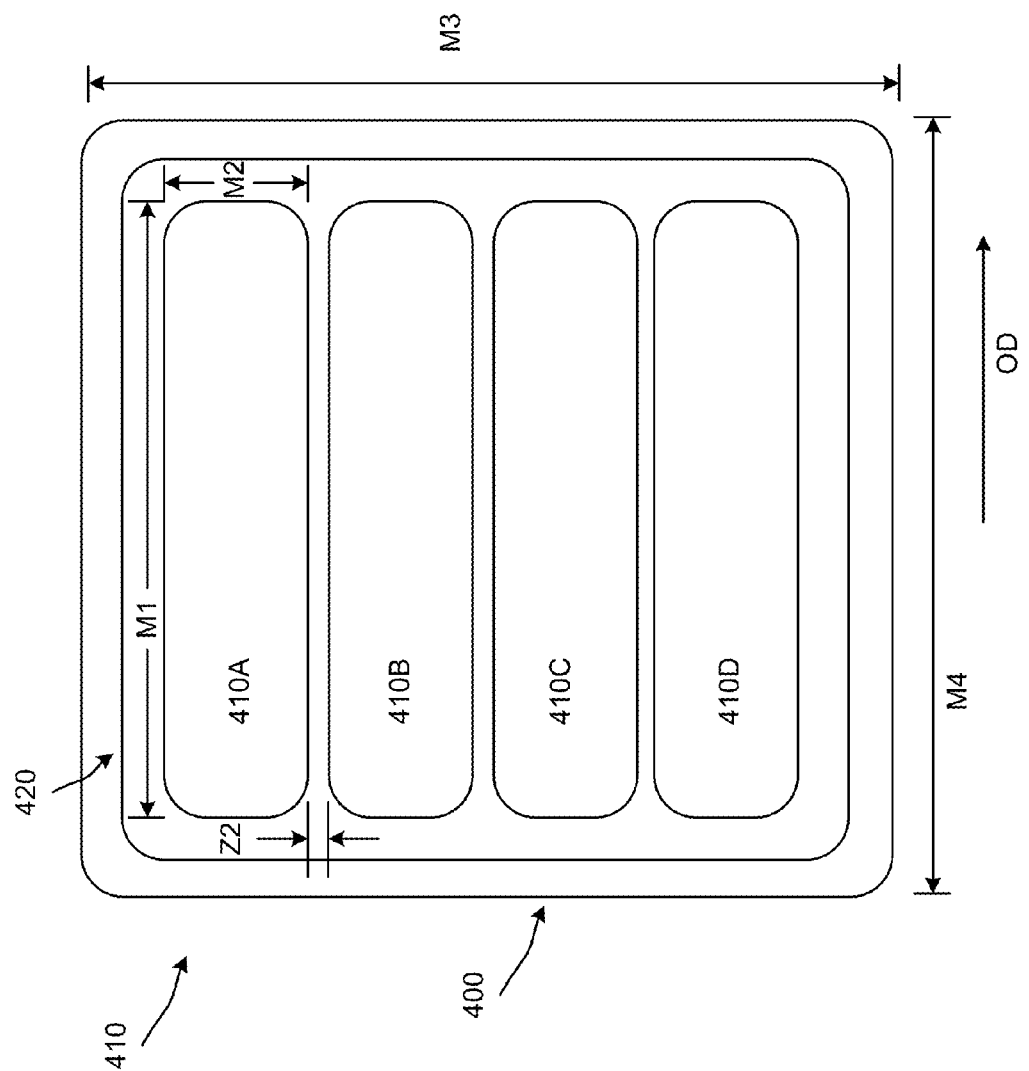
FIG. 4 is a diagram that illustrates portions that operate as a semiconductor device within a SiC crystal.

FIG. 4 is a diagram that illustrates several portions 410A through 410D that collectively operate as a single semiconductor device 410 within a SiC crystal 400. One or more of the portions 410A through 410D can be electrically coupled by one or more interconnect (not shown) (e.g., interconnect portions, interconnect 360). A stacking fault area is not shown in FIG. 4, however, the portions 410A through 410D are longitudinally aligned along (e.g., substantially aligned along) the off-orientation direction to minimize or reduce the impact of defects such as stacking faults. The semiconductor device 410 has a termination region 420 surrounding the portions 410A through 410D so that portions 410A through 410D are disposed within the termination region 420. In some implementations, one or more of portions 410A through 410D can be offset a few degrees from off-orientation direction OD.

For example, an aspect ratio (e.g., length:width ratio) of the portion 410A is defined such that a length of the portion 410A is aligned along the off-orientation direction OD. The aspect ratio of each of the individual portions 410A and 410D is different than the aspect ratio of the semiconductor device 410. The aspect ratio of the semiconductor device 410 in such instances can be aligned along (e.g., longitudinally aligned along) the same direction as the aspect ratio of a stacking fault. A length M1 (which is longer than a width M2) of portion 410A is non-parallel to (e.g., orthogonal to) a length M3 (which is longer than a width M4) of the semiconductor device 410.

The layout shown in FIG. 4 can be used to define a square or a near-square chip (or device) layout for an application including the semiconductor device 410 while taking advantage of the alignment of sub-components or portions of the semiconductor device 410 along the off-orientation direction OD. In other words, subcomponents or portions of the semiconductor device 410 included within a single termination region 420 can be (e.g., can each be) aligned along the off-orientation direction OD while the entirety of the semiconductor device 410 may not be aligned along the off-orientation direction OD. In some implementations, the semiconductor device 410 can have a different shape than a rectangle such as a square, a hexagonal shape, and so forth.

In some implementations, the semiconductor device 410 can include more or less portions than shown in FIG. 4. Although not shown, in some implementations, the semiconductor device 410 can have more than one termination region. For example, a portion 410A can be at least partially surround by a first termination region and the remaining portions 410B through 410D can be surround by a second termination region. Such an embodiment the portion 410A can be electrically coupled (via an interconnect) with one or more of the portions 410A through 410D.

As shown in FIG. 4, the portion 410A and the portion 410B (which can be referred to a pair of portions) are separated by a stacking fault separation region 405 having a dimension Z2 (also can be referred to as a spacing, width, or also can be referred to as a stacking fault separation volume or area). Other stacking fault separation regions or areas (between other pairs of the portions) are not labeled. The dimension Z2 (or width) is aligned orthogonal to (e.g., substantially orthogonal to) the lengths of the portions 410A through 410D and/or is aligned orthogonal to (e.g., substantially orthogonal to) the off-orientation direction OD.

As described in connection with FIG. 3A, the stacking fault separation region 405 is devoid (e.g., substantially devoid of) minority carriers such that a stacking fault area does not propagate between the portions 401A through 410D of the semiconductor device 410. The portion 410A and the portion 410B are separated so that a stacking fault area (not shown) does not propagate across the entirety of the semiconductor device 410. For example, the stacking fault stripe may not propagate from portion 410A to portion 410B even if portion 410B is stressed at a relatively high forward current density.

The stacking fault separation region 405 is disposed outside of the active region of the portion 410A and outside of the active region of the portion 410B. The stacking fault separation region 405, however, is disposed within the termination region 420 surrounding both the portion 410A and the portion 410B.

As it is seen from, for example, the emission images of FIGS. 1B at 1C, the lateral propagation of stacking faults along the ion-implanted junction termination region can be stopped with a length of, for example, only a few microns. This can be explained by residual damage in ion-implanted p-type SiC. Residual damage decreases minority carrier lifetime and suppresses minority carrier injection. In addition, residual damage also increases the sheet resistance of an ion-implanted layer. Additional measures for blocking the lateral current flow and SF propagation can be optionally applied as it will be explained in further Embodiments.

In some implementations, the dimension Z2 between the portion 410A and the portion 410B can be greater than (e.g., at least 2 times) or equal to a thickness (e.g., thickness HA in FIG. 2A, thickness HB in FIG. 2B, thickness of 140 in FIG. 1) of one or more epitaxial layers (not shown) of the semiconductor device 410. In some implementations, the one or more epitaxial layers can be relatively low-doped layers associated with, for example, a drift region of the semiconductor device 410. In some implementations, the drift region can be excluded from the termination region 420. In some implementations, the dimension Z2 (or width) can be greater than (e.g., at least 2 times greater than) or equal to a size (e.g., a depth, length) of a drift region of the semiconductor device 410 (or a portion thereof). An example of a drift region having a depth DR0 is shown in FIGS. 5 and 6. The portions 410A through 410D have a rectangular shape, but in some implementations, one or more of the portions 410A through 410D can have a non-rectangular shape (e.g., a parallelogram, a trapezoid, a triangle).

The semiconductor devices 110, 210A through 210E, 310, 410 (and/or portions thereof) described herein can be, or can include, a variety of devices or cells including a BJT device (or cell), a MOSFET device (or cell), a Schottky device (or cell), and/or so forth. Examples of such devices (or cells) are described in, for example, FIGS. 5 through 7 below.

FIG. 5 represents a unit cell 531 of a Schottky-barrier diode rectifier. The unit cell 531 of the rectifier can be formed on an off-oriented heavily doped n-type 4H SiC substrate 550. A lightly doped n-type epitaxial drift region 540 having a thickness DR0 is disposed on the substrate 550. An optional buffer layer 541 is disposed between substrate 550 and drift region 540 to, for example, mitigate substrate crystal imperfections. The doping (e.g., doping concentration or doping level) of the buffer layer 541 can be at least several times higher than the doping of the drift region 540 in some implementations, however it could approach the n-type doping of the substrate 550. The unit cell 531 can include a trench 533 having a trench bottom 532 (or bottom surface) and trench sidewalls 533A and 533B. A heavily doped ion-implanted p-type region 534 can be included adjacent the trench sidewalls 533A, 533B and trench bottom 532. A heavy acceptor doping exceeding $10^{20}$ $cm^{-3}$ can be included in the region 531, at least near the trench bottom 532 and/or the surface of trench walls 533A and 533B. A portion 535 of the SiC mesa surface can have an n-type conductivity. A metal contact 536 can be included on top of the semiconductor region 560 so as to form a Schottky barrier to n-type portions of SiC the portion 535. An Ohmic contact with contact 551 can be included at the back side of the crystal. Implanted regions of neighbor unit cells (similar to unit cell 531) can form a periodic PN diode grid, which can be oriented (or shaped) in an elongated fashion along an off-orientation direction OD as described herein.

One advantage of using a PN diode grid in a Schottky-barrier rectifier is electrostatic shielding of shielding of the Schottky-barrier metal, which could be otherwise exposed to, for example, a high electric field. Avalanche breakdown in a junction barrier schottky (JBS) diode can occur at the PN-diode grid, which can resolve reliability issues that can arise in a non-shielded Schottky-barrier rectifier. The trench design of the JBS can be more readily design optimized as compared to a fully planar design, because the depth of the p-body can be readily increased to a specified value without using, for example, high implant energies (which may not be practical in manufacturing).

Another advantage of the PN diode grid is its handling of a high forward surge current. A Schottky-barrier rectifier without a built-in PN body diode may not be as robust in handling an overload in on-state current, because device self-heating results in a drop in carrier mobility and in increase of the forward voltage drop as result. In contrast, the PN diode grid of a JBS rectifier can have a behavior, which is similar to the behavior of a planar PN diode. A high forward bias in a PN-diode can result in injection of minority carriers, which can minimize the forward voltage drop and permit relatively fail-safe operation under the conditions of forward-current overload. Though beneficial, such injection represents a reliability risk due to the bipolar degradation via growth of stripe-type stacking faults. According to this embodiment, such risk is mitigated by sectioning the rectifier in elongated sub-components as described herein.

The high power rectifier is sectioned in two or more elongated sub-component rectifiers of smaller area, each sub-component having the longer side that is parallel to the off-orientation direction. Each sub-component can include an array of unit cells 531. The sub-component rectifier devices can include a common junction termination in the same manner as that shown in, for example, FIG. 4. A cross-section of the region between sub-component rectifiers according to this embodiment is shown in, for example, FIG. 6.

A sub-component rectifier can include a continuous rim of anode implant 537 as shown in FIG. 6. In FIG. 6 such rims are shown as 537A and 537B for two neighbor sub-components. Field-limiting regions 521A, 521B, and 521C are disposed between the adjacent rectifiers to avoid or minimize electric field concentration. Regions 521A, 521B, and 521C are provided medium-dose acceptor implant. The role of the field-limiting regions can be same as of a Junction Termination Extension at the device periphery, such as the region 320 in FIG. 3. The requirements to optimum implant dose in these regions can be the same as those known for design of the JTE 320. The optimum dose of electrically active acceptors can be slightly (approximately 5% to 20%) lower, that the characteristic dose $Q_A$, which dose $Q_A$ corresponds to full depletion of such p-type region at the conditions of avalanche breakdown. The characteristic dose $Q_A$ is governed by the Gauss Law, $Q_A = E_{CR} \in_0 \in_R / q$, where $E_{CR}$ is the critical field for avalanche breakdown, $\in_0$ the dielectric constant $\in_R$ the permittivity of SiC and q the electron charge. Gaps 522A and 522B in p-implant can be formed between regions 521A and 521B, as well as between 521B and 521C. The gaps 522A and 522B can be formed with a relatively narrow width that can be substantially smaller than the thickness of the drift region DR0. Forming the gaps 522A, 522B in the field-limiting implant substantially narrow will prevent excessive concentration of electric field next to the gaps 522A, 522B. The gaps 522A, 522B can prevent (or substantially prevent) lateral current flow under the conditions of a high forward bias and it will therefore assist termination of SF propagation. The number of gaps 522A, 522B in the field-limiting implant can optionally be greater than 2 so as to further assist suppression of SF propagation. The SiC surface in the region between neighbor subcomponents can further include a dielectric coating 523.

Figure 7:
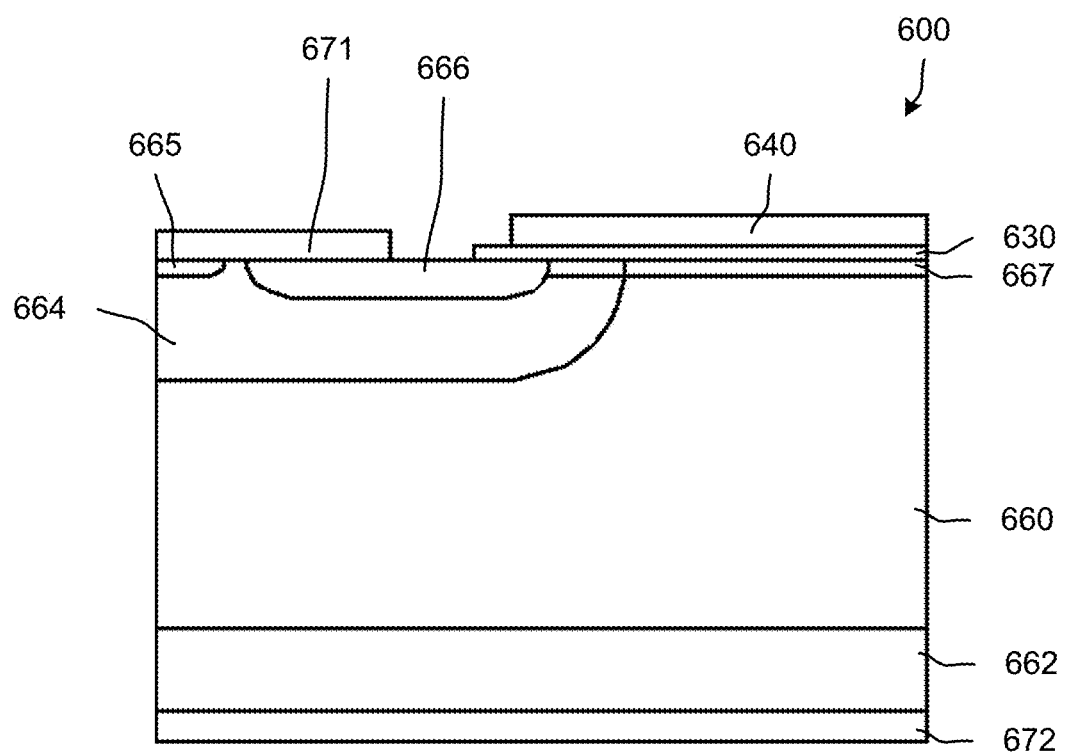
FIG. 7 is a block diagram that illustrates a unit cell of a cross-sectional view of a shielded SiC metal-oxide-semiconductor field-effect transistor (MOSFET) device.

FIG. 7 is a block diagram that illustrates a unit cell 600 of a cross-sectional view of a shielded SiC metal-oxide-semiconductor field-effect transistor (MOSFET) device (also can be referred to as a vertical MOSFET device). As shown in FIG. 7 an epitaxial layer 660 (e.g., N-type) is disposed over a substrate 662 (e.g., N+ substrate). A source region 666 (e.g., N+ source region) and a body region 664 (e.g., p-type body region) are formed. A heavily doped p-type subcontact region 665 is formed in the body region 664 to, for example, minimize resistance of the contact to the body region 664. A shallow donor implant region 667 that can have dose between approximately $10^{12}$ and $5 \times 10^{12}$ $cm^{-2}$ is further included for, for example, control of a desired MOSFET threshold voltage. The MOSFET can be normally in an off-state, and can include a gate dielectric 630. Gate 640 can overlap the top surface including a portion of the source region 666 a portion of the body region 664 and a surface of the lightly doped n-type SiC. A source contact 671 can be applied to a well in the gate dielectric 630, which contact can also define an Ohmic contact to the body region 664 via the subcontact region 665. A drain 672 contact can be included on a back side of the substrate. Source and drain contacts 671 and 672, respectively, can be formed by sintering nickel (Ni) to SiC so as to define a nickel silicide. In some embodiments, the gate dielectric 630 is a silicon dioxide with a layer of silicon oxinitride adjacent to a dielectric interface to the SiC. Such a near-interface oxinitride layer can be formed by a high-temperature anneal of silicon dioxide dielectric on SiC in an ambient containing $N_2O$ or NO.

The unit cell 600 shown in FIG. 7 can be duplicated in a large array to define a MOSFET (also can be referred to as a MOSFET array). The unit cell 600 may be included in a 1-dimensional linear array or may be arranged as a 2-dimensional array in, for example, a rectangular or in a hexagonal pattern. The array can include 2-level metallization using interconnect techniques, which can be utilized in silicon power MOSFET technology. The MOSFET in an array according to this embodiment should be substantially elongated along the direction of off-orientation direction OD, in a similar manner to, for example, that disclosed for SiC rectifiers herein. The MOSFET can alternately sectioned in elongated sub-components in the manner similar to that described herein.

In some implementations, a body diode of the unit cell 600 of the MOSFET can be used as a rectifier, for example, in an inverter circuit. The injection of minority carriers may provoke growth of, for example, stripe-shaped stacking faults. The elongated shape of MOSFET array (or of sub-component a MOSFET array) can mitigate the degradation due to the growth of stacking faults.

The unit cell shown in FIG. 7 represents a vertical MOSFET with a planar inversion channel. Multiple design variations are known for the unit cells of high-power vertical SiC MOSFETs, which include other configurations for the MOSFETs having a planar inversion channel, which may differ from that shown in FIG. 7. Bipolar degradation of power MOSFETs may not significantly depend on exact configuration of the unit cell, because most of the stacking fault is located in the bulk of the drift region, as it is shown FIGS. 2A, 2B and 2C. It is therefore beneficial to arrange the MOSFET unit cells in the elongated configurations shown in FIGS. 1A, 3A, 3B and 4 for any type of a unit cell of vertical power MOSFET in SiC. Unit cell of a vertical power MOSFET in SiC may as well utilize a trench-type design, in which the inversion channel is arranged on a trench sidewall (e.g., arranged in a vertical direction with respect to a plane along which a substrate and/or a wafer are aligned, arranged in a vertical direction which is orthogonal to off orientation direction OD).

Figure 8A:
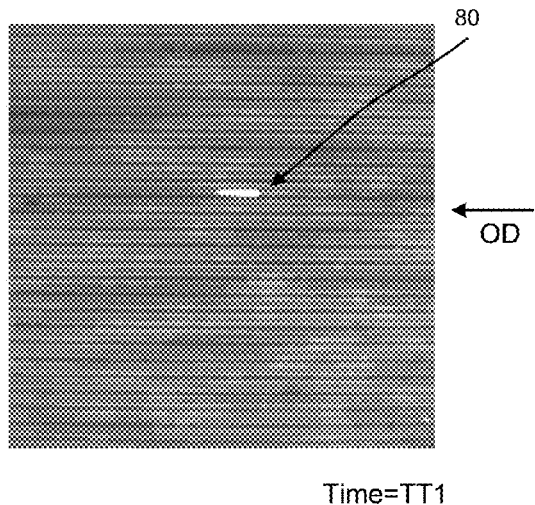
FIGS. 8A through 8C are emission images of stacking faults in SiC PN diodes that illustrate development of a stacking fault triangle.
Figure 8B:
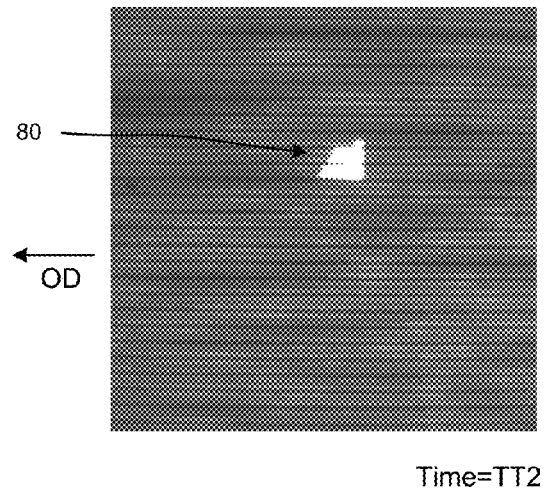
Figure 8C:
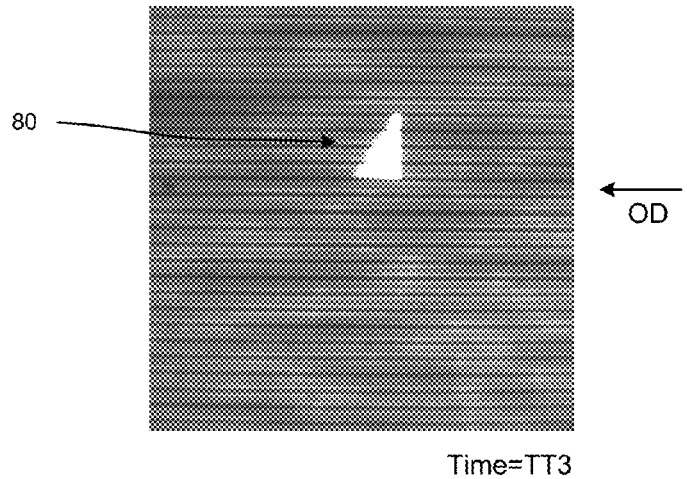

FIGS. 8A through 8C are emission images of stacking faults in SiC PN diodes that illustrate development of a stacking fault triangle 80. FIGS. 8A, 8B, and 8C illustrate the stacking fault triangle 80 at times TT1, TT2, and TT3, respectively. FIG. 8A illustrates the start of formation of the stacking fault triangle 80 starting at time TT1 at a dislocation line, which can be approximately parallel to an off-orientation direction OD. The stacking fault triangle 80 increases to the size (e.g., area) shown in FIG. 8B at time TT2 and further increases to the size (e.g., area) shown in FIG. 8C at time TT3.

Figure 9A:
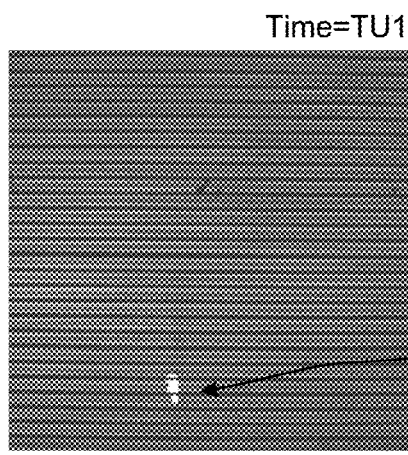
FIGS. 9A through 9E are emission images of stacking faults in SiC PN diodes that illustrate development of a stacking fault stripe.
Figure 9B:
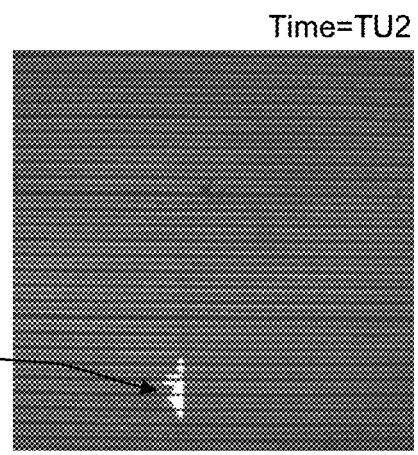
Figure 9C:
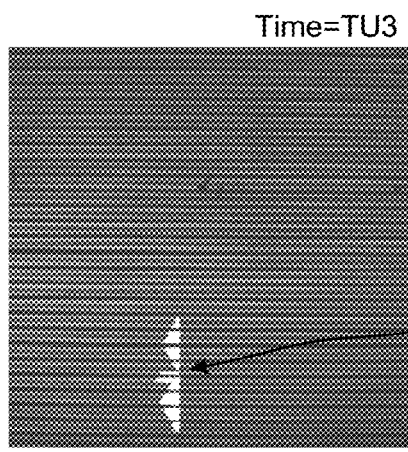
Figure 9D:
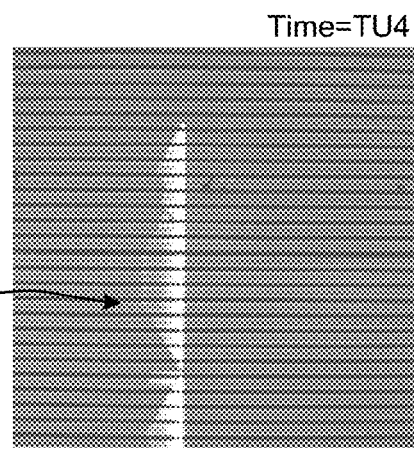
Figure 9E:
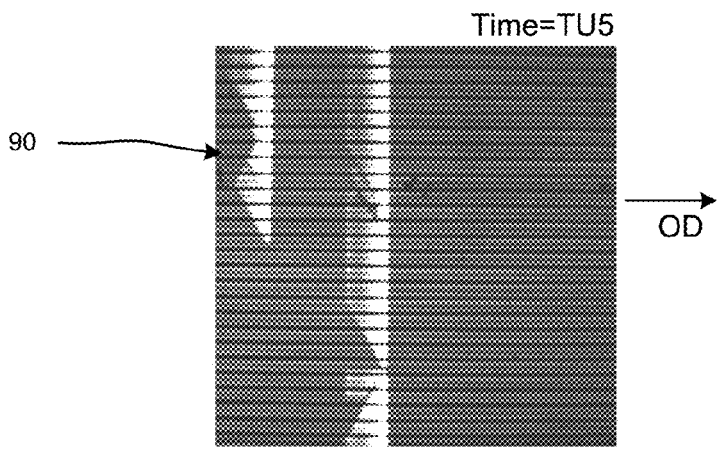

FIGS. 9A through 9E are emission images of stacking faults in SiC PN diodes that illustrate development of a stacking fault stripe 90. FIGS. 9A through 9E illustrate the stacking fault stripe 90, respectively, at times TU1 through TU5. FIG. 9A illustrates the start of formation of the stacking fault stripe 90 starting at time TU1 at a dislocation line and generally orthogonal to an off-orientation direction OD. The stacking fault stripe 90 increases to the size (e.g., area) shown in FIG. 9B at time TU2 and further increases to the size (e.g., area) shown in FIG. 9C at time TU3. FIGS. 9D and 9E are zoomed in views (relative to the views in FIG. 9A through 9C) of further development of the stacking fault stripe 90 at times TU4 and TU5, respectively. In this example, the stacking fault stripe 90 first starts to appear at a top portion (e.g., surface) of an epitixial layer or stack and expands generally downward toward a substrate.

Figure 10:
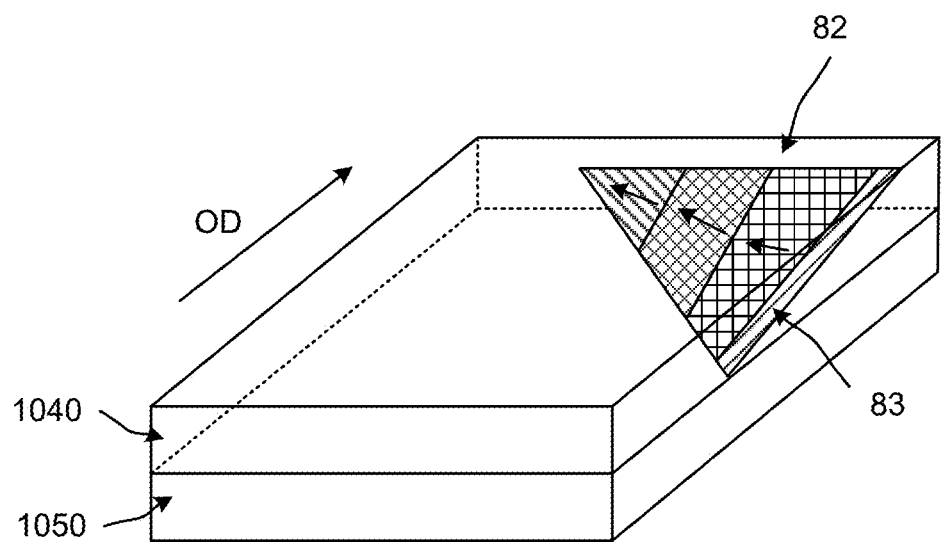
FIG. 10 illustrates development of a stacking fault triangle.

The growth (e.g., development) of a stacking fault triangle 82 from a dislocation 83 (as shown by arrows) within an epitaxial layer 1040 above a substrate 1050 is illustrated in FIG. 10. A top p-layer is not shown in FIG. 10, and the stacking fault triangle 82 forms approximately a 60 degree right triangle.

Figure 11:
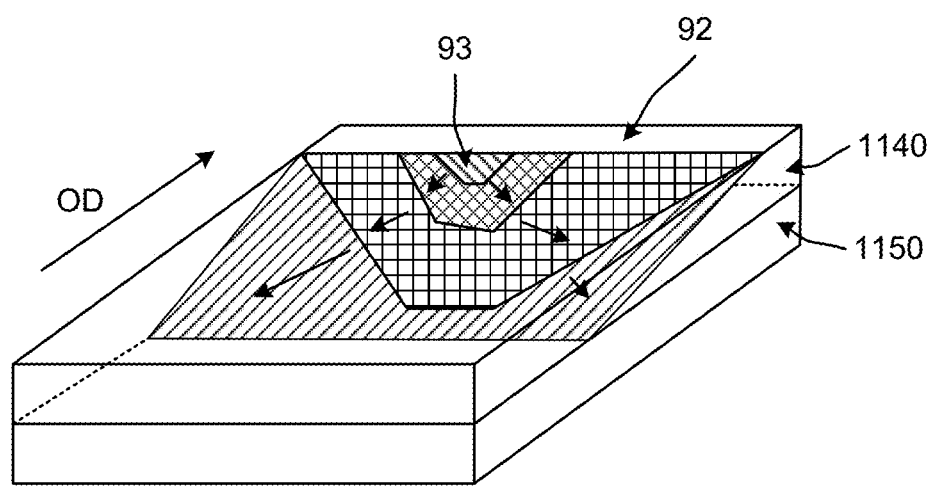
FIG. 11 illustrates development of a stacking fault stripe.

FIG. 11 illustrates growth (e.g., development) of a stacking fault stripe 92 from a dislocation 93 within an epitaxial layer 1140 (e.g., at a top portion or surface of the epitaxial layer 1140). The stacking fault 93 first appears in the top portion or surface of the epitaxial layer 1140 (or stack) and expands generally down towards a substrate 1150 as is shown by arrows. Accordingly, the source of the stacking fault stripe 93 or degradation is located at the top of the epitaxial layer 1140, not at a substrate-to-epi interface.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus for a silicon carbide (SiC) crystal semiconductor device, comprising:
a silicon carbide (SiC) crystal having a top surface aligned along a plane, the SiC crystal having an off-orientation direction from a basal (0001) plane; and
a semiconductor device having at least a portion defined within the SiC crystal, the semiconductor device being a vertically oriented device, the semiconductor device having an outer perimeter, the outer perimeter having a first side aligned along the off-orientation direction and a second side aligned along a direction non-parallel to the off-orientation direction, the first side of the outer perimeter of the semiconductor device having a length longer than the second side of the outer perimeter of the semiconductor device.

2. The apparatus of claim 1, wherein the second side is aligned along a direction substantially orthogonal to a direction of a direction of propagation of a stacking fault.

3. The apparatus of claim 1, wherein the semiconductor device is a vertically oriented device having a minimum rated voltage of 400 Volts and a minimum rated current of 4 Amperes.

4. The apparatus of claim 1, wherein the outer perimeter of the semiconductor device is defined by a region free of minority carriers when the semiconductor device is operating.

5. The apparatus of claim 1, wherein the outer perimeter of the semiconductor device is defined by a termination region of the semiconductor device.

6. The apparatus of claim 1, wherein the first side has a length that is at least 1.5 longer than a length of the second side.

7. The apparatus of claim 1, wherein the first side is orthogonal to the second side.

8. The apparatus of claim 1, wherein an entirety of the first side is longer than the entirety of the second side.

9. An apparatus for a silicon carbide (SiC) crystal semiconductor device, comprising:
a first portion of a semiconductor device having at least a portion defined within a silicon carbide crystal and having a length greater than a width, the length of the first portion of the semiconductor device being aligned along an off-orientation direction from the basal (0001) plane of the silicon carbide crystal, the semiconductor device being a vertical device;
a second portion of a semiconductor device having a length greater than a width, the length of the second portion of the semiconductor device being aligned parallel to the first portion of the semiconductor device; and
a termination region disposed at least partially around the first portion of the semiconductor device and at least partially around the second portion of the semiconductor device.

10. The apparatus of claim 9, wherein the first semiconductor device is separated from the second semiconductor device by a region excluding a drift region such that a stacking fault included in the first semiconductor device is prevented from propagating to the second semiconductor device.

11. The apparatus of claim 9, wherein the first portion of the semiconductor device is electrically coupled to the second portion of the semiconductor device via an interconnect.

12. The apparatus of claim 9, wherein the first semiconductor device is separated from the second semiconductor device by a stacking fault separation region substantially excluding minority carriers that facilitate propagation of a stacking fault.

13. The apparatus of claim 9, wherein the first semiconductor device is separated from the second semiconductor device by a stacking fault separation region disposed outside of an active region of the first portion and outside of the an active region of the second portion.

14. The apparatus of claim 9, wherein the termination region has an outer perimeter different that has an aspect ratio different than an aspect ratio of the first portion or the aspect ratio of the second portion.

15. An apparatus for a silicon carbide (SiC) crystal semiconductor device, comprising:
a first portion of a semiconductor device having at least a portion defined within an epitaxial layer of a silicon carbide crystal and having a length greater than a width, the length of the first portion of the semiconductor device being aligned along an off-orientation direction from a basal plane of the silicon carbide crystal, the semiconductor device being a vertically-oriented device;
a second portion of a semiconductor device having a length greater than a width, the length of the second portion of the semiconductor device being aligned parallel to the first portion of the semiconductor device; and
a stacking fault separation region disposed between the first portion and the second portion, the stacking fault separation region having a width equal to or greater than a thickness of the epitaxial layer.

16. The apparatus of claim 15, wherein the width of the separation region is greater than two times the thickness of the epitaxial layer.

17. The apparatus of claim 15, wherein the width of the separation region is greater than a drift region of the semiconductor device included in the epitaxial layer.

18. The apparatus of claim 15, wherein the width of the separation region is greater than two times a drift region of the semiconductor device included in the epitaxial layer.

19. The apparatus of claim 15, further comprising:
a termination region disposed at least partially around the first portion of the semiconductor device and at least partially around the second portion of the semiconductor device.

20. The apparatus of claim 15, wherein the stacking fault separation region is defined by a region free of minority carriers when the semiconductor device is operating.

* * * * *